United States Patent
Cheng et al.

(10) Patent No.: US 7,262,615 B2
(45) Date of Patent: Aug. 28, 2007

(54) METHOD AND APPARATUS FOR TESTING A SEMICONDUCTOR STRUCTURE HAVING TOP-SIDE AND BOTTOM-SIDE CONNECTIONS

(75) Inventors: Edmond Cheng, Cedar Park, TX (US); Addi B. Mistry, Austin, TX (US); David T. Patten, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 11/263,089

(22) Filed: Oct. 31, 2005

(65) Prior Publication Data

US 2007/0096760 A1    May 3, 2007

(51) Int. Cl.
 *G01R 31/02*    (2006.01)
(52) U.S. Cl. ..................... 324/755; 324/765
(58) Field of Classification Search ............... 324/765, 324/754, 758, 761
See application file for complete search history.

(56) References Cited

U.S. PATENT DOCUMENTS

| | | | | |
|---|---|---|---|---|
| 4,820,975 | A * | 4/1989 | Diggle | 324/758 |
| 5,055,777 | A * | 10/1991 | Bonelli et al. | 324/754 |
| 5,150,041 | A * | 9/1992 | Eastin et al. | 324/758 |
| 5,222,014 | A * | 6/1993 | Lin | 361/792 |
| 5,473,510 | A * | 12/1995 | Dozier, II | 361/719 |
| 5,523,586 | A * | 6/1996 | Sakurai | 257/48 |
| 5,672,978 | A * | 9/1997 | Kimura | 324/754 |
| 5,734,270 | A * | 3/1998 | Buchanan | 324/754 |
| 5,781,021 | A * | 7/1998 | Ilani | 324/754 |
| 6,069,482 | A * | 5/2000 | Hilton | 324/755 |
| 6,072,325 | A * | 6/2000 | Sano | 324/758 |
| 6,337,577 | B1 * | 1/2002 | Doherty et al. | 324/765 |
| 6,359,452 | B1 * | 3/2002 | Mozzetta | 324/754 |
| 6,411,079 | B1 * | 6/2002 | Nishikawa | 324/158.1 |
| 6,599,764 | B1 | 7/2003 | Ang et al. | |
| 6,690,185 | B1 * | 2/2004 | Khandros et al. | 324/758 |
| 6,756,802 | B2 * | 6/2004 | Cram | 324/762 |
| 6,759,860 | B1 * | 7/2004 | Hsiung et al. | 324/755 |
| 7,008,238 | B2 * | 3/2006 | Hofmeister et al. | 439/70 |
| 2002/0000829 | A1 * | 1/2002 | Akram et al. | 324/765 |
| 2004/0173894 | A1 | 9/2004 | Glenn et al. | |
| 2005/0182585 | A1 | 8/2005 | Yang | |

* cited by examiner

*Primary Examiner*—Ha Tran Nguyen
*Assistant Examiner*—Arleen M. Vazquez
(74) *Attorney, Agent, or Firm*—Joanna G. Chiu; Ranjeev Singh

(57) ABSTRACT

A method for testing a semiconductor structure having a set of top-side connections and having a set of bottom-side connections is provided. The method may include providing a device socket for connecting the set of top-side connections and the set of bottom-side connections to a tester. The method may further include providing a device hood for connecting the set of top-side connections to a respective first end of each of a plurality of interconnects in the device hood, wherein a second end of each of the plurality of interconnects in the device hood connects the set of top-side connections to the device socket. The method may further include testing the semiconductor structure using the tester. The semiconductor structure may include at least one integrated circuit to be tested.

20 Claims, 3 Drawing Sheets

METHOD AND APPARATUS FOR TESTING A SEMICONDUCTOR STRUCTURE HAVING TOP-SIDE AND BOTTOM-SIDE CONNECTIONS

FIELD OF THE INVENTION

This invention relates generally to semiconductor structures, and more specifically, to testing semiconductor structures having top-side and bottom-side connections.

RELATED ART

As technology advances, the complexity of integrated circuits also increases. During the manufacture of these integrated circuits, it is desirable to be able to test the circuits as early in the process as possible in order to weed out the bad ones prior to subsequent, and often costly, processing or prior to delivery to customers. However, at some points during the manufacturing process, full test coverage may not be achievable, thus preventing the detection of bad parts which may result in increased manufacturing cost and reduced quality. For example, some packaged integrated circuits have signal connections on both the top and bottom sides of the package. However, current testing assemblies are unable to fully test these types of integrated circuits.

BRIEF DESCRIPTION OF THE DRAWINGS

The present invention is illustrated by way of example and is not limited by the accompanying figures, in which like references indicate similar elements.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION OF THE DRAWINGS

One embodiment relates to the testing of semiconductor structures having both top-side and bottom-side signal connections. The semiconductor structure may include one or more integrated circuits. In this manner, an integrated circuit can be fully tested prior to attaching another device or integrated circuit via the top-side signal connections. Another embodiment relates to the testing of integrated circuits located on an array substrate, where the array substrate also includes both top-side and bottom-side signal connections. The ability to test these integrated circuits and arrays more fully may allow for the detection of bad parts prior to subsequent processing or prior to delivery to customers.

Figure 1:
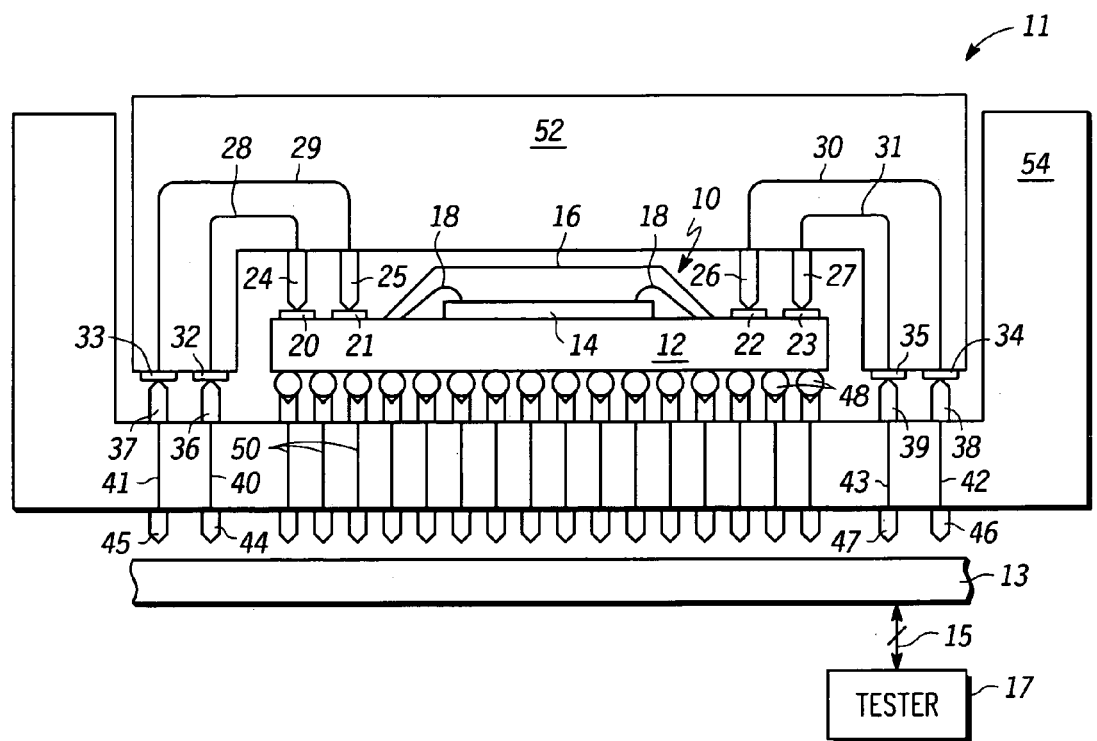
FIG. 1 illustrates a cross sectional view of a testing assembly in accordance with one embodiment of the present invention.

FIG. 1 illustrates a cross sectional view of a testing assembly 11 in accordance with one embodiment of the present invention. Testing assembly 11 includes a device hood 52 and a device socket 54. As illustrated in FIG. 1, a packaged integrated circuit (IC) 10 is being tested within testing assembly 11 (where packaged IC 10 may also be referred to as a semiconductor structure). Packaged IC 10 includes a package substrate 12, an integrated circuit (IC) 14 (which may also be referred to as an IC die or a semiconductor die) overlying package substrate 12, interconnects 18, and an encapsulant 16 over IC 14 and interconnects 18. IC 14 may be any type of integrated circuit or semiconductor device having any type of functionality. Also, interconnects 18 are illustrated in FIG. 1 as wire bond connections; however, in alternate embodiments, any type of interconnects may be used. For example, interconnects 18 may be implemented as a ball grid array (such as in a flip chip configuration). In the illustrated embodiment, encapsulant 16 surrounds IC 14 and interconnects 18 while exposing a portion of package substrate 12. Note that in alternate embodiments, encapsulant 16 may have different forms than the one illustrated in FIG. 1. For example, the sides of encapsulant 16 may be more or less slanted than illustrated, or may be rounded. Also, conventional encapsulation materials and methods may be used to form encapsulant 16.

Packaged IC 10 also includes top-side pads 20-23 for providing top-side signal connections and bottom-side electrical connectors 48 for providing bottom-side signal connections. (Therefore, note that top-side pads 20-23 may also be referred to as top-side connections and bottom-side electrical connectors 48 may also be referred to as bottom-side connections.) In the illustrated embodiment, top-side pads 20-23 are located over the portions of package substrate 12 exposed by encapsulant 16. Interconnects 18 electrically couple IC 14 to any or all of top-side pads 20-23 and to any or all of bottom-side electrical connectors 48 via routing in package substrate 12. Top-side pads 20-23 may be used to provide signal connections to IC 14, to electrical connectors 48 (through package substrate 12), or to both IC 14 and electrical connectors 48.

In the illustrated embodiment, bottom-side electrical connectors 48 are illustrated as solder balls, such as in a ball grid array (BGA) arrangement. However, in alternate embodiments, note that other types of bottom-side connections may be used, such as, for example, pad or bumps. For example, bottom-side electrical connectors 48 may be landing pads implemented as a land grid array (LGA). Similarly, although the top-side connections are illustrated as pads, other types of top-side electrical connections may be used, such as, for example, solder cladding, solder balls or bumps. Device hood interconnects 28-31 may also be implemented in a variety of ways. In one embodiment, device hood interconnects 28-31 are implemented using one or more ribbon cables. Alternatively, one or more sets of wires may be used.

Note that conventional processing techniques and materials may be used to form packaged IC 10. Also, note that packaged IC 10 may include any number of integrated circuits or die. For example, although only a single die 14 is illustrated in FIG. 1, any number of die may be vertically stacked onto substrate 12 or horizontally arranged on packaged substrate 12, or both vertically stacked and horizontally arranged on package substrate 12. In yet another alternate embodiment, any number of packaged ICs may be stacked onto packaged IC 10, where the uppermost packaged IC may include top-side pads, such as pads 20-23. Therefore, packaged IC 10 may be any type of packaged IC having both top-side and bottom-side connections, and is not limited to the embodiment illustrated in FIG. 1.

Testing assembly 11 may therefore be used to simultaneously test both the top-side and bottom-side connections of packaged IC 10. Device hood 52 is used to provide testing connections to top-side pads 20-23. For example, device hood pins 24-27 contact each of top-side pads 20-23, respectively. Device hood pins 24-27 are routed through device hood 52 with device hood interconnects 28-31, respectively, to device hood contact pads 32-35, respectively. That is, note that device hood 52 connects the set of top-side connections (e.g. top-side pads 20-23) to a respective first end of each of a plurality of interconnects (e.g. interconnects 28-31) in device hood 52 where a second end of each of the plurality of interconnects connects the top-side connections to device socket 54 (via, e.g., device hood contact pads 32-35). Therefore, note that all pads or electrical connectors used to provide/receive signals to/from IC 14 are accessible via a same side of packaged IC 10. In this manner, as will be described below, all top-side and bottom-side connections may be tested simultaneously.

Testing assembly 11 also includes device socket 54. In the illustrated embodiment of FIG. 1, packaged IC 10 rests on device socket 54, where device socket 54 includes top-side device socket pins 36-39 which provide electrical connections to device hood contact pads 32-35. Top-side device socket pins 36-39 are routed through device socket 54 with device socket interconnects 40-43, respectively, to bottom-side device socket pins 44-47, respectively. Device socket 54 also includes a plurality of device socket connections 50 which route signals between bottom-side electrical connectors 48 and bottom-side device socket pins similar to pins 44-47. Therefore, by routing each of the top-side electrical connections (top-side pads 20-23) through device hood 52 and then through device socket 54 (via the connection provided by device hood contact pads 32-35 and top-side device socket pins 36-39) and by routing each of the bottom-side electrical connections (connectors 48) through device socket 54, both top-side and bottom-side connections of packaged IC 10 are accessible via the bottom-side of device socket 54.

In one embodiment, for testing, the bottom-side device socket pins are electrically connected to a load board 13. The load board communicates with a tester 17 via conductors 15 (where any number of uni-directional conductors or bi-directional conductors, or combination thereof may be used). In one embodiment, tester 17 may be an ATE (Automatic Test Equipment). Tester 17 performs the testing of packaged IC 10 by sending/receiving signals via the load board and testing assembly 11. Any type and configuration of load board and tester may be used, as desired, to test packaged IC 10. For example, in one embodiment, device socket 54 may be directly connected to an integrated circuit tester where device socket 54 is a top surface of the IC tester, or device socket 54 may include a load board such as load board 13. Therefore, any configuration may be used to couple an IC tester with device socket 54 to allow for testing of packaged IC 10.

In one embodiment, packaged IC 10 will be used as part of a multi-package system. For example, any number of packaged IC may be vertically stacked onto packaged IC 10. In this case, the packaged IC immediately over packaged IC 10 would be connected to packaged IC 10 via top-side pads 20-23. (In one embodiment, after vertically stacking two or more packaged ICs, the vertical stack may be encapsulated so as to form a single package which includes multiple packaged ICs.) Therefore, prior to using packaged IC 10 in a multi-package system, it can be fully tested with testing assembly 11. For example, in one embodiment, the ATE tester may be used to emulate other IC's which will be stacked onto packaged IC 10 so that the full functionality of packaged IC 10 may be tested prior to stacking.

Furthermore, through the routing of signals through device hood 52, both top-side and bottom-side connections of packaged IC 10 may be simultaneously tested using a same planar load board, such as load board 13. That is, both the top-side connections and bottom-side connections of packaged IC 10 may be provided in a single plane, such as to device socket 54, to load board 13, or to an IC tester.

Testing assembly 11 may have a variety of different configurations, and is not limited to the shape or form illustrated in FIG. 1. For example, device socket 54 may be a planar portion without vertically extending walls as illustrated in FIG. 1. Also, testing assembly can be implemented in a variety of different orientations (an example of which will be discussed below in reference to FIG. 4). Although device hood 52 and device socket 54 are illustrated in FIG. 1 as two physically separate assembly portions, in alternate embodiments, device hood 52 and device socket 54 may be portions of a single one-piece assembly, or may be formed using any number of physically separate portions. Furthermore, any method of bringing device hood 52 and device socket 54 into contact with packaged IC 10 may be used. For example, in one embodiment, device socket 54 is fixed in a single position while a downward force is applied to the top of device hood 52, bringing it into electrical contact with the top-side of packaged IC 10 and the top-side of device socket 54, and bringing the bottom-side of packaged IC 10 in electrical contact with the top-side of device socket 54. Alternatively, an upward force may be applied to device socket 54. In yet another embodiment, as will be described in reference to FIG. 4, device hood 52 and device socket 54 may be pivotally joined. Also, any or all of the pins described herein with respect to the device hood and device socket (of any embodiment) may be implemented as spring-loaded pins.

FIG. 1 illustrates the testing of a single packaged IC 10. However, in alternate embodiments, multiple packaged IC may be tested in parallel. In this case, multiple device hoods and sockets may be included as part of assembly 11, or device hood 52 and device socket 54 may be extended to accommodate any number of packaged ICs which are separate from packaged IC 10.

In yet another embodiment, device hood 52 and device socket 54 may be used to test a semiconductor structure having top-side and bottom-side connections but having no IC. For example, the semiconductor structure being tested in assembly 11 may simply be a package substrate having top-side connections and bottom-side connections, where at least a portion of the top-side connections are routed to the bottom-side connections. In this case, the semiconductor structure may be tested prior to attaching any ICs (packaged or not) onto the semiconductor structure. Therefore, assembly 11 can test any type of semiconductor structure (including 0 or more ICs), where packaged IC 10 is only one example.

Figure 2:
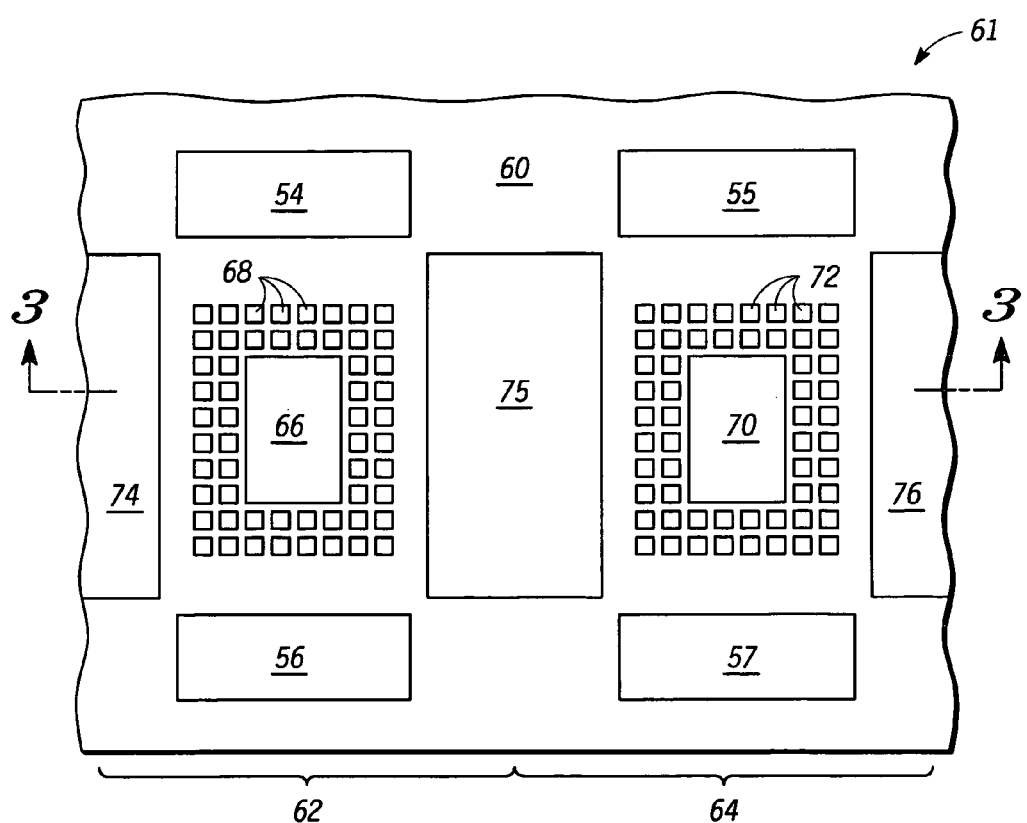
FIG. 2 illustrates a top-down view of a portion of a substrate array in accordance with one embodiment of the present invention.

FIG. 2 illustrates a top-down view of an array 61 of semiconductor structures in accordance with one embodiment of the present invention. In the illustrated embodiment, array 61 is an array of IC's where each semiconductor structure of array 61 includes at least one IC. Array 61 can be an N×M array, where each of N and M can be any integer number greater than or equal to 1. Therefore, array 61 includes a plurality (e.g. N multiplied by M) of ICs. Array 61 may also be referred to as a strip. Array 61 includes an array substrate 60. Array substrate 60 includes a plurality (e.g. N multiplied by M) of individual substrates such as individual substrates 62 and 64. That is, upon singulating array substrate 60, each of individual substrates 62 and 64 will form a packaged IC (where these packaged IC may remain as individual packaged ICs or may be used in a multi-package system as was described above).

Individual substrate 62 includes a die 66 (also referred to as IC 66) attached to a top surface of array substrate 60 and a plurality of top-side pads 68 at least partially surrounding die 66 on the top-side of array substrate 60. In the illustrated embodiment, die 66 is attached in a flip chip configuration to array substrate 60 via a plurality of bumps (not visible in the top-down view of FIG. 2). The plurality of bumps is routed to top-side pads 68 through array substrate 60. Note also that an underfill may be used between die 66 and array substrate 60. Similarly, individual substrate 64 includes a die 70 (also referred to as IC 70) attached to a top surface of array substrate 60 and a plurality of top-side pads 72 at least partially surrounding die 70 on the top-side of array substrate 60. In the illustrated embodiment, die 70 is also attached in a flip chip configuration to array substrate 60 via a plurality of bumps (not visible in the top-down view of FIG. 2). The plurality of bumps is routed to top-side pads 72 through array substrate 60. Note also that an underfill may be used between die 70 and array substrate 60. Each of individual array substrates 62 and 64 also includes bottom-side pads located on a bottom side of array substrate 60 (not visible in the top-down view), which may also provide electrical connections to each of die 66 and 70, respectively. The bottom-side pads can provide connections to the corresponding die, to some of the top-side pads surrounding the corresponding die, or to any combination thereof.

Conventional processing techniques and materials may be used to form the array substrate of FIG. 2. Also, note that other techniques may be used to attach and electrically connect die 66 and 70 to their corresponding top-side pads. For example, wire bonds may be used to provide electrical connections, where, in this example, a die attach may additionally be used to physically attach die 66 and 70 to array substrate 60. Also, in the case of wire bonding, the die may not be "flipped" onto array substrate 60.

Array substrate 60 also includes a plurality of openings 54-57 and 74-76. These openings may be used to provide access through array substrate 60, as will be described in reference to FIG. 3. Alternatively, as will be further described in reference to FIG. 3, each of openings 54-57 and 74-76 may be implemented as a plurality of different openings rather than a single opening. In yet another embodiment, these openings may not be openings but may include additional routing from the top-side of array substrate 60 to the bottom-side of array substrate 60.

Figure 3:
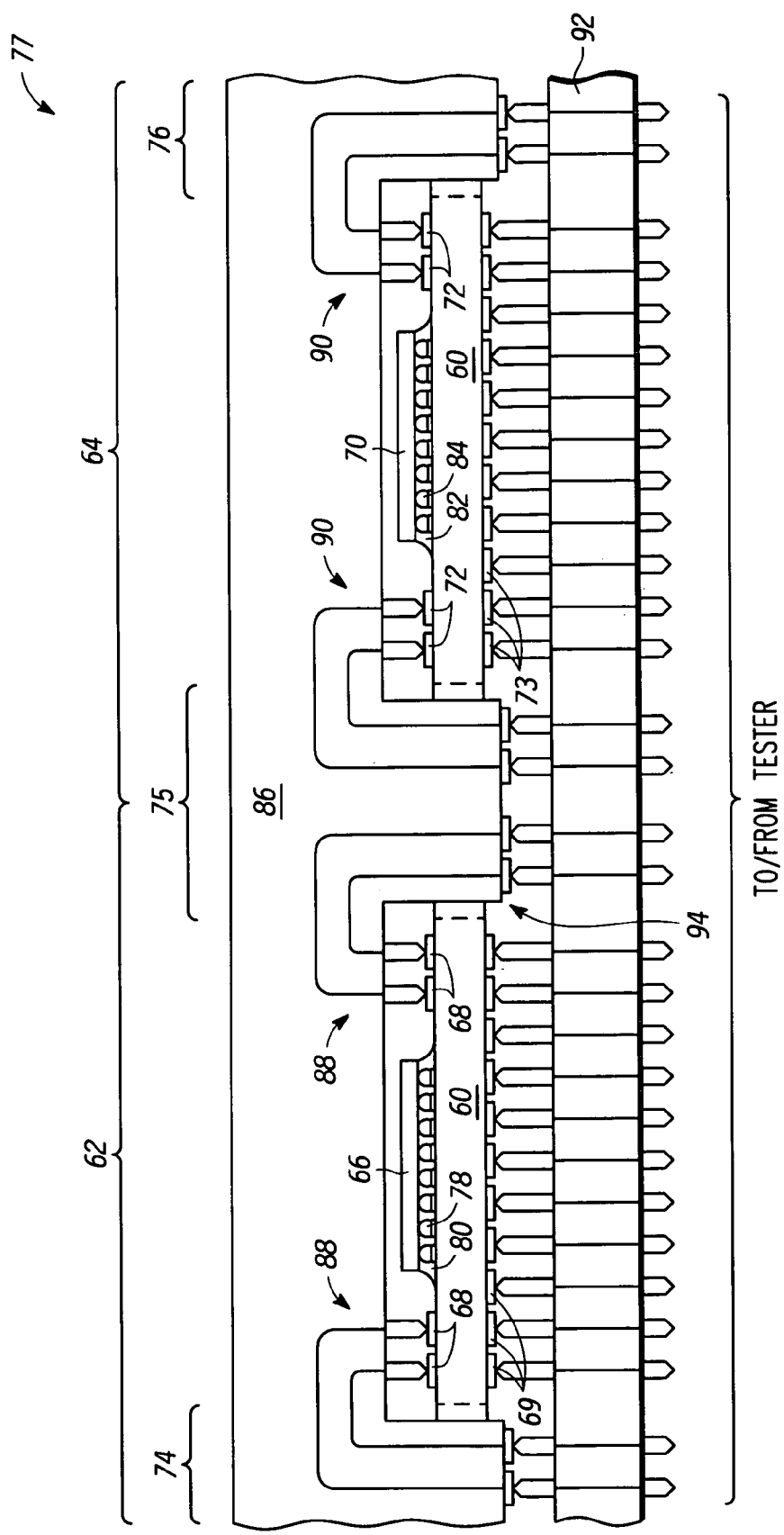
FIG. 3 illustrates a cross-sectional view of the array of FIG. 2 in a tester assembly in accordance with one embodiment of the present invention.

FIG. 3 illustrates a cross-sectional view of array substrate 60 of FIG. 2 while in a tester assembly 77. In the cross-section of FIG. 3, bumps 78 and underfill 80 are visible between die 66 and array substrate 60. Bumps 78 provide electrical connections between die 66 and top-side pads 68, via routing in array substrate 60, and between die 66 and bottom-side pads 69, via routing through array substrate 60. Underfill 80 provides additional physical attachment between die 66 and array substrate 60. Similarly, bumps 84 provide electrical connections between die 70 and top-side pads 72, via routing in array substrate 60, and between die 70 and bottom-side pads 73, via routing through array substrate 60. Underfill 82 provides additional physical attachment between die 70 and array substrate 60.

As illustrated in FIG. 3, testing assembly 77 includes a device hood 86 and a device socket 92. Device hood 86 routes electrical connections from top-side pads 68 and 72 via device hood electrical interconnects 88 and 90, respectively, to device socket 92. Device socket 92 routes each of the signals between top-side pads 68 and 72 and a load board (not shown) and between bottom-side pads 69 and 73 and the load board. The load board may then be used to communicate with a tester (not shown). Therefore, note that the descriptions and examples provided above for load board 13, conductors 15, and tester 17 also apply here.

In the embodiment of FIG. 3, protruding portions of device hood 86, such as portion 94, which route the top-side connections, extend down through the openings (such as opening 75) so as to be able to contact device socket 92. Alternatively, though, each of openings 74-76 may be implemented as a plurality of openings where only the pins of device hood 86 extend to device socket 92 (or where the pins of device socket 92 extend up through the openings to contact device hood 86). In yet another alternate embodiment, openings 74-76 may not exist. Instead, array substrate 60 may use the areas corresponding to openings 74-76 to route connections between device hood 86 and device socket 92. Also, note that the same descriptions apply to openings 54-57 (which are not visible in the view of FIG. 3).

Many of the same alternatives, configurations, and orientations described above for device hood 52 and device socket 54 also apply to device hood 86 and device socket 92. For example, device socket 92 is illustrated as planar, but may take any shape. Similarly, device hood 86 may take any shape. Also, device hood 86 and device socket 92 may be physically separate portions or may be formed as a single one-piece assembly. The same methods described above for bringing device hood 52 and device socket 54 into contact also apply here. Also, a full array may be tested simultaneously or only portions of the array may be tested at a time.

In one embodiment, after testing, the die on the array substrate may be encapsulated and then singulated. Alternatively, the die may be singulated prior to encapsulation or packaging. The singulating and encapsulating may done using known processing techniques. In yet another alternate embodiment, array 61 may be tested prior to any IC's (such as die 66 and 70) being attached thereto.

Therefore, note that the use of testing assembly 77 for testing die 66 and 70 allow for the simultaneous testing of top-side and bottom-side connections of each of die 66 and 70. This may allow, for example, for full coverage testing, which may be used to detect bad parts prior to continuing in the manufacturing process. Furthermore, as described above in reference to packaged IC 10, testing assembly can be used to emulate additional ICs that are to be coupled to each die in order to achieve better test coverage. Also, the routing of all signals to be tested to a bottom-side of device hood 86 and a bottom-side of array substrate 60 allows for the use of a planar device socket 92 and a planar load board for testing.

Figure 4:
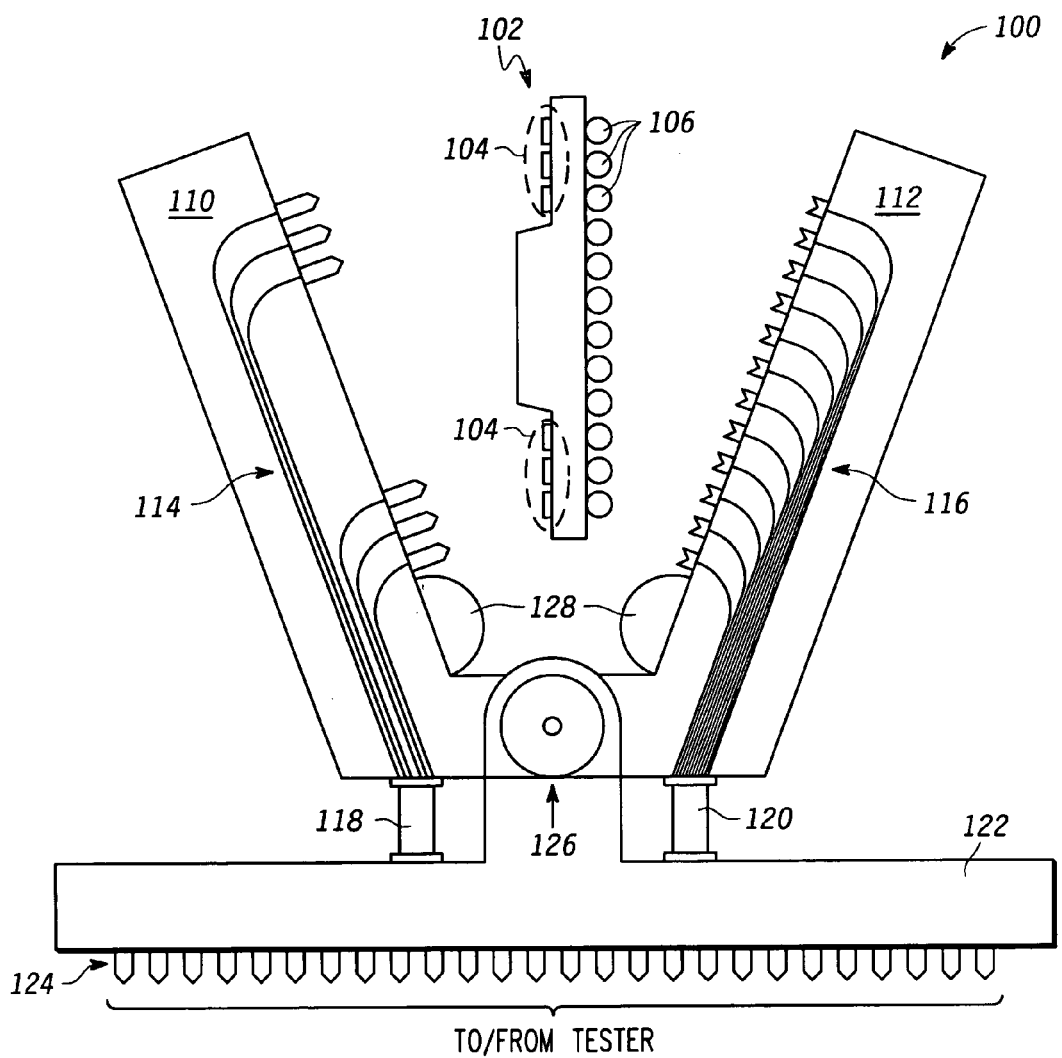
FIG. 4 illustrates a cross-sectional view of a clamp testing assembly in accordance with one embodiment of the present invention.

FIG. 4 illustrates a clamp testing assembly 100 in accordance with one embodiment of the present invention. Testing assembly 100 may be used to test any type of semiconductor structure having top-side and bottom-side connections. For example, the semiconductor structure being tested may be a packaged IC such as packaged IC 102. Packaged IC 102 includes top-side pads 104 on a top-side of packaged IC 102 and bottom-side electrical connectors 106 on a bottom side of packaged IC 102. Packaged IC 102 may be any type of packaged IC having both top-side and bottom-side connections. For example, it may have the form of packaged IC 10 where the descriptions provided above with respect to packaged IC 10 also apply to packaged IC 102. Also, the descriptions provided above for top-side pads 20-23 and bottom-side electrical connectors 48 apply top-side pads 104 and bottom-side electrical connectors 106, respectively, as well.

Testing assembly 100 includes a device hood 110 which provides electrical connections 114 between top-side pads 104 and a pillar 122 (via connections 118). Testing assembly also includes a device socket 112 which provides electrical connections 116 between bottom-side electrical connectors 106 and pillar 122 (via connections 120).

In the illustrated embodiment, testing assembly 100 is in a vertical orientation where device hood 110 and device socket 112 form a clamp structure, hinged at hinge 126, which close onto top and bottom sides of packaged IC 102. That is, device hood 110 and device socket 112 may be pivotally joined. Device hood 110 and device socket 112 each include a stopper 128 to help hold and align packaged IC 102 between device hood 110 and device socket 112. In a clamped position, device hood 110 is in electrical contact with top-side pads 104 and device socket 112 is in electrical contact with bottom-side electrical connectors 106. Also, in the clamped position, packaged IC 102 is held in place. In one embodiment, connections 118 and 120 are ribbon cables which allow for flexibility as clamp testing assembly 100 opens and closes. Alternatively, connections 118 and 120 may be any type of connections or wiring.

In one embodiment, clamp testing assembly 100 opens just enough to allow a packaged IC to slide between the hood and socket. This may allow for improved alignment and easier handling. In this manner, a packaged IC can be positioned by sliding into the clamp. Note that stoppers 128 may be formed and shaped in a variety of ways to allow packaged IC 102 to be inserted between device hood 110 and device socket 112 from the top (vertically downward) or from the front or back (into or out of the page).

Test pillar 122 provides structural support for device hood 110 and device socket 112 and routes the connections from ribbon cables 118 and 120 to pillar bottom-side pins 124. As discussed above, these pins 124 may be spring-loaded pins and may be used to provide connections with a load board, which communicates with a tester. The same descriptions provided above with respect to the load board and tester also apply here.

In one embodiment, pillar 122 remains in a fixed position while device hood 110 and device socket 112 are able to move about hinge 126. In alternate embodiments, device hood 110 and device socket 112 may not be hinged together, but instead, may be two separate portion which are pushed together while still in a vertical orientation (or any other orientation). In this case, one of the hood and socket may be in a fixed position while a force is applied on the other one of the hood and socket, or alternatively, both may be pushed together. Also, any type of hinge may be used to implement hinge 126. Furthermore, other ways of connecting hood 110 and socket 112 may be used other than hinge 126. For example, a sliding mechanism may be used to slide the socket and hood portions together.

By now it should be appreciated that there has been provided a method and assembly for simultaneously testing top-side and bottom-side signal connections of an IC through the use of a device hood and device socket. By routing all signals to a single side, all the signals can easily be provided in a single plane for improved accessibility. For example, the single plane can then be provided directly to a tester or to a tester via, for example, a planar load board. Also, the ability to more fully test devices may allow for reduced cost and may allow for improved quality of devices.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of the present invention.

Moreover, the terms "front", "back", "top", "bottom", "over", "under", "right", "left" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. The terms "a" or "an", as used herein, are defined as one or more than one. The term "plurality", as used herein, is defined as two or more than two. The term "another", as used herein, is defined as at least a second or more.

The term "coupled", as used herein, is defined as connected, although not necessarily directly, and not necessarily mechanically.

What is claimed is:

1. A method for testing a semiconductor structure having a set of top-side connections and having a set of bottom-side connections, the method comprising:

providing a device socket having an interconnecting side for connecting the set of top-side connections and the set of bottom-side connections to a tester;

providing a device hood for connecting each top-side connection of the set of top-side connections to a corresponding interconnect of a plurality of interconnects in the device hood, and for connecting each interconnect to a corresponding top-side connection, wherein the plurality of interconnects in the device hood connects the set of top-side connections to the device socket, and wherein the plurality of interconnects are routed through the device hood and through the device socket to the interconnecting side of the device socket, such that both the set of top-side connections and the set of bottom-side connections are accessible in a single plane parallel to the interconnecting side of the device socket; and testing the semiconductor structure using the tester.

2. The method of claim 1, wherein the set of bottom-side connections comprises at least one of a set of solder cladding, a set of solder balls, a land grid array, a set of pads, and a set of bumps, and the set of top-side connections comprises at least one of a set of solder cladding, a set of solder balls, a land grid array, a set of pads, and a set of bumps.

3. The method of claim 1, wherein the device hood further comprises a plurality of device hood pins, wherein each one of the plurality of device hood pins is connected to corresponding interconnect of the plurality of interconnects in the device hood.

4. The method of claim 3, wherein the plurality of device hood pins are spring-loaded pins.

5. The method of claim 1, wherein the plurality of interconnects in the device hood comprise at least one of a ribbon-cable and a set of wires.

6. The method of claim 1, wherein the device socket is connected via a load board to the tester.

7. The method of claim 1, wherein the device socket comprises at least one of a load board and a top surface of the tester.

8. The method of claim 1, wherein the semiconductor structure comprises at least one integrated circuit, wherein at least a portion of the set of top-side connections is electrically coupled to the at least one integrated circuit.

9. The method of claim 8, wherein the at least one integrated circuit comprises a plurality of integrated circuits.

10. The method of claim 9, wherein each of the plurality of integrated circuits is packaged.

11. The method of claim 1, wherein the device socket and the device hood are pivotally joined.

12. The method of claim 1, wherein testing the at least one integrated circuit using the integrated circuit tester further comprises simultaneously testing both the set of top-side connections and the set of bottom-side connections.

13. The method of claim 12, further comprising providing the set of top-side connections and the set of bottom-side connections in a single plane to at least one of a load board and the tester.

14. A method for testing an array of semiconductor structures, each semiconductor structure of the array of semiconductor structures having a set of top-side connections and having a set of bottom-side connections, the method comprising:

providing a device socket having an interconnecting side for connecting the set of top-side connections and the set of bottom-side connections of at least one semiconductor structure of the array of semiconductor structures to a tester;

providing a device hood for connecting each top-side connection of the set of top-side connections to an interconnect of a plurality of interconnects in the device hood, and for connecting each interconnect to a top-side connection wherein the plurality of interconnects in the device hood connects the set of top-side connections of the at least one semiconductor structure of the array of semiconductor structures to the device socket, and wherein the plurality of interconnects are routed through the device hood and through the device socket to the interconnecting side of the device socket, such that both the set of top-side connections and the set of bottom-side connections are accessible in a single plane parallel to the interconnecting side of the device socket; and testing the at least one semiconductor structure of the array of semiconductor structures using the tester.

15. The method of claim 14, wherein the set of bottom-side connections comprises at least one of a set of solder cladding, a set of solder balls, a land grid array, a set of pads, and a set of bumps.

16. The method of claim 14, wherein the device hood further comprises a plurality of device hood pins, wherein each one of the plurality of device hood pins is connected to corresponding interconnect the plurality of interconnects in the device hood.

17. The method of claim 14, wherein each semiconductor structure of the array of semiconductor structures comprises at least one integrated circuit electrically coupled to at least a portion of the set of top-side connections of the each semiconductor structure.

18. The method of claim 14, wherein the plurality of interconnects in the device hood comprise at least one of a ribbon-cable and a set of wires.

19. The method of claim 14, wherein the device socket is connected via a load board to the tester.

20. The method of claim 14, wherein the device socket is at least one of a load board and a top surface of the tester.

* * * * *